United States Patent [19]

McEwan

[11] Patent Number: 6,072,427

[45] Date of Patent: Jun. 6, 2000

[54] PRECISION RADAR TIMEBASE USING HARMONICALLY RELATED OFFSET OSCILLATORS

[76] Inventor: Thomas E. McEwan, 30772 San Remo Dr., Carmel Highlands, Calif. 93923

[21] Appl. No.: 09/285,220

[22] Filed: Apr. 1, 1999

[51] Int. Cl.[7] .................................................. G01S 7/483
[52] U.S. Cl. ......................... 342/175; 342/100; 342/195; 342/199; 331/2
[58] Field of Search ............................... 342/175, 91, 92, 342/93, 98, 99, 100, 193, 194, 195, 199; 331/2, 18, 46, 47

[56] References Cited

U.S. PATENT DOCUMENTS

| | | | |
|---|---|---|---|
| 4,000,466 | 12/1976 | Scouten et al. | 324/181 |
| 4,042,884 | 8/1977 | Querry | 329/122 |
| 4,132,991 | 1/1979 | Wocher et al. | 342/134 |
| 4,214,205 | 7/1980 | Guest | 455/20 |
| 4,245,196 | 1/1981 | Peebles, Jr. et al. | 331/178 |
| 4,245,354 | 1/1981 | Guest | 455/259 |
| 4,251,777 | 2/1981 | Sartorius et al. | 328/155 |
| 4,322,832 | 3/1982 | Sartorius | 368/47 |
| 4,677,395 | 6/1987 | Baker | 331/25 |
| 4,974,236 | 11/1990 | Gurcan et al. | 375/61 |
| 5,150,078 | 9/1992 | Yang et al. | 331/2 |
| 5,260,670 | 11/1993 | Ainsworth et al. | 328/151 |
| 5,343,168 | 8/1994 | Guthrie | 331/16 |

OTHER PUBLICATIONS

"A 8 GHz silicon bipolar clock–recovery and data–regenerator IC", Pottbacker, A.; Langmann, U., Solid–State Circuits Conference, 1994. Digest of Technical Papers. 41st ISSCC., 1994 IEEE International, 1994, pp. 116–117.

"A 150 Mbit/s CMOS clock recovery PLL including a new improved phase detector and a fully integrated FLL", Routama, J.; Koli, K.; Halonen, K., Circuits and Systems, 1998. ISCAS '98. Proceedings of the 1998 IEEE International Symposium on vol. 1, 1998.

"Time synchronization over the Internet using an adaptive frequency–locked loop", Levine, J., Ultrasonics, Ferroelectrics and Frequency Control, IEEE Transactions on vol. 46 Jul. 4, 1999, pp. 888–896, 1994.

*Primary Examiner*—John B. Sotomayor
*Attorney, Agent, or Firm*—Ernest J. Beffel, Jr.; Haynes & Beffel LLP

[57] ABSTRACT

Two crystal oscillators are configured as a "plug-and-play" precision transmit-receive clock that requires no calibration during manufacture. A first crystal oscillator generates a transmit clock and a second crystal oscillator operates at a small offset from a harmonic of the first oscillator. A turnstile circuit selects pulses from the second oscillator to trigger a receive clock. Both the transmit and receive clocks operate at the same frequency. One edge of the receive clock is smoothly slipped, or swept, in phase across a limited range such as 0 to 36 degrees relative to the transmit clock with the slip rate set by the harmonic frequency offset. In one embodiment, a quadrature frequency-locked-loop is used to accurately control the slip rate while preventing false frequency locks. This timebase can be used to clock equivalent time radar, laser, and TDR ranging systems with picosecond accuracy. Applications include automotive backup and collision warning radars, precision radar rangefinders for fluid level sensing and robotics, and universal object/obstacle detection and ranging.

31 Claims, 9 Drawing Sheets

6,072,427

PRECISION RADAR TIMEBASE USING HARMONICALLY RELATED OFFSET OSCILLATORS

BACKGROUND OF THE INVENTION

1. Field of the Invention

The present invention relates to radar timing circuits, and more particularly to precision swept delay circuits for equivalent time ranging systems. It can be used to generate a swept-delay clock for sampling-type radar, TDR and laser systems.

2. Description of Related Art

High-resolution pulse-echo systems such as wideband pulsed radar, pulsed laser rangefinders, and time domain reflectometers generally sweep a timing circuit across a range of delays. The timing circuit controls a receiver sampling gate such that when an echo signal coincides with the temporal location of the sampling gate, a sampled echo signal is obtained. The echo range is then determined from the timing circuit, so highly accurate timing is needed to obtain accurate range measurements.

One approach to generate swept timing employs open or closed-loop analog techniques: (1) open-loop circuits generally use an analog voltage ramp to drive a comparator, with the comparator reference voltage controlling the delay, and (2) closed-loop timing circuits generally employ a phase-locked loop (PLL), wherein the phase difference between a transmit and a receive clock is measured and controlled with a phase comparator and control loop. Both architectures have their limitations—open-loop circuits are subject to component and temperature variations, and are not very accurate due to the difficulty in generating a precision voltage ramp with sub-nanosecond accuracy; and closed-loop circuits rely on analog component ratios to set the accuracy. Examples of closed-loop architectures are disclosed in U.S. Pat. No. 5,563,605, a "Precision Digital Pulse Phase Generator" by McEwan, and in copending application, "Phase-Comparator-Less Delay Locked Loop", Ser. No. 09/084,541, by McEwan. The present invention significantly improves upon the accuracy of analog swept delay circuits by eliminating the accuracy-limiting analog components altogether.

Another approach to generate swept timing employs two oscillators with frequencies $F_T$ and $F_R$ that are offset by a small amount $F_T-F_R=\Delta$. In a radar application, a transmit clock at frequency $F_T$ triggers transmit RF pulses, and a receiver clock at frequency $F_R$ gates the echo RF pulses. If the receive clock is lower in frequency than the transmit clock by a small amount $\Delta$, it will smoothly and linearly slip in phase relative to the transmit clock such that one full cycle is slipped every $1/\Delta$ seconds. Typical figures are: transmit clock $F_T=1$ MHz, receive clock $F_R=0.9999$ MHz, $\Delta=100$ Hz, and slip period=$1/\Delta=10$ milliseconds.

The receive gate samples the radar echoes and produces an output voltage that varies with the phase of the receive clock relative to the transmit clock (and the radar echoes). This variation occurs on a 10 ms scale, and represents events occurring on a 1 $\mu$s scale. The corresponding time expansion factor is 10 ms/1 $\mu$s=10000. Thanks to this expansion effect, events on a 10-picosecond scale are converted to an easily measurable 100-nanosecond scale. In contrast, a real time counter would need a 100 GHz clock to measure with 10 ps resolution, well beyond present technology.

This two-oscillator technique was used in the 1960's in precision time-interval counters with sub-nanosecond resolution, and appeared in a short-range radar in U.S. Pat. No. 4,132,991, "Method and Apparatus Utilizing Time-Expanded Pulse Sequences for Distance Measurement in a Radar," by Wocher et al.

The accuracy of the two-oscillator technique is limited by the accuracy of the clocks, which can be extremely accurate, and by the smoothness and linearity of the phase slip between them. No means or data appears in the prior art to support the accuracy of the phase slip—it is not easy to measure, and it is also easy to assume it is somehow perfect. Unfortunately, there are many influences that can affect the smoothness of the phase slip that are addressed by the present invention. These include digital cross-talk that can produce 100 ps error or more, and offset frequency control circuit aberrations than can introduce even more substantial phase slip nonlinearities.

A significant drawback with the two-oscillator technique is that the phase slips over a full 360 degrees of the transmit clock. Ideally, a radar system will gate over perhaps the first 36 degrees after a transmit pulse. The remaining 324 degrees is dead time to allow for distant echoes to diminish before the next cycle. If this dead time is too short, range ambiguities will result. Thus, the receiver in the two-oscillator systems spends 90% of its time phase slipping over out-of-range, potentially ambiguous echoes. In effect, 90% of the transmitted pulses are wasted. What is needed is a two-oscillator timing system that phase slips over only the first ~36-degrees, coupled with a system that resolves crosstalk and control errors. In addition, a low cost implementation is essential to the commercial success of the innumerable non-contact ranging applications based on the present invention.

SUMMARY OF THE INVENTION

The present invention employs a first crystal oscillator in a transmit clock circuit, and a second crystal oscillator in a receive clock circuit. The first crystal oscillator generates a transmit clock at a frequency $F_T$ and the second crystal oscillator operates at a small offset frequency $\Delta$ from the $N^{th}$ harmonic $NF_T$ of the first oscillator, or $NF_T-\Delta$. A pulse selector, or turnstile circuit, in the receive clock circuit is first enabled by the transmit clock and then triggered by pulses from the second oscillator to produce a receive clock of the same frequency $F_R$ as the transmit clock at $F_T$, but with one digital edge that accurately slips in phase across a limited range, such as 36 degrees.

Since the second oscillator produces more pulses in a given period than the first oscillator, the turnstile circuit assures that only one receive clock pulse occurs for each transmit pulse. Thus, the turnstile circuit lets only one of many pulses through in a contiguous head-to-tail fashion, so a smooth sweep of a receive clock edge is obtained.

A further embodiment of the present invention employs a frequency locked loop (FLL) to accurately control the slip rate $\Delta$, and to phase lock $\Delta$ to an external reference frequency $\Delta_{REF}$ through an optional phase lock port. The FLL employs a quadrature phase detector to reliably lock to small values of $-\Delta$ without a false lock at $+\Delta$. Alternatively, the FLL may employ a control voltage saturation detector to prevent a false lock at $+\Delta$.

The present invention differs greatly from prior art timing systems based on offset oscillators in that: (1) the transmit and receive clocks of the present invention operate at the same frequency $F_T=F_R$, rather than at $F_R=F_T-\Delta$ as seen in the prior art, (2) the phase of one digital edge of the receive clock slips over a limited range such as 36 degrees, rather than the entire receive clock waveform (both edges) slipping over a full 360 degrees, (3) the offset oscillator operates at a common harmonic multiple of the transmit oscillator, rather than at the fundamental frequency, and (4) a high performance sampling-type FLL is used.

A primary object of the present invention is to provide a high accuracy swept timing circuit for time-of-flight ranging systems.

Another object of the present invention is to provide a high accuracy swept timing circuit that sweeps over a limited range.

Yet another object of the present invention is to provide a "plug-and-play" timing system for highly accurate, low-cost ranging systems.

A further object of the present invention is to eliminate errors due to crosstalk and control loop aberrations.

Yet another object of the present invention is to provide an implementation with a minimum of components to facilitate widespread use in low-cost commercial and consumer rangefinding applications.

The present invention can be used as a clock in equivalent time radar, laser, and TDR ranging systems with picosecond accuracy. Applications include low cost radars for security alarms, home automation and lighting control, industrial and robotic controls, automatic toilet and faucet control, automatic door openers, fluid level sensing radars, imaging radars, vehicle backup and collision warning radars, and universal object/obstacle detection and ranging. One specific embodiment utilizing the present invention is a time domain reflectometer where a pulse is propagated along a conductor or guidewire to reflect from a material for use in a variety of applications, such as an "electronic dipstick" for fluid level sensing.

BRIEF DESCRIPTION OF THE DRAWINGS

FIG. 3b is the linearity error of the straight-line ramp of FIG. 3a.

DETAILED DESCRIPTION OF THE INVENTION

A detailed description of the present invention is provided below with reference to the figures. While illustrative component values and circuit parameters are given, other embodiments can be constructed with other component values and circuit parameters. All U.S. Patents and copending U.S. applications cited herein are herein incorporated by reference.

Figure 1:
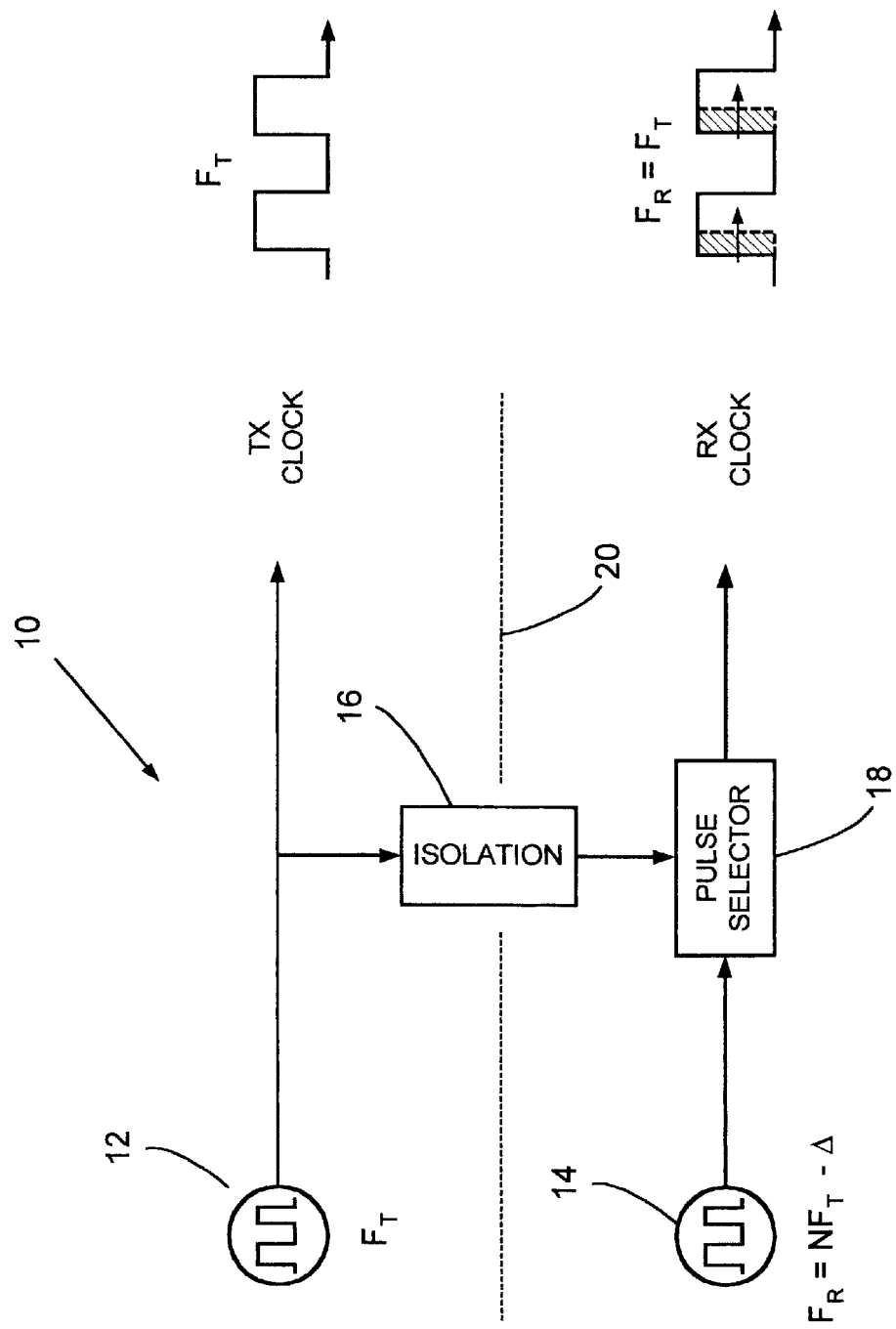
FIG. 1 is a block diagram showing a transmit (TX) and receive (RX) clock system of the present invention.

FIG. 1 is a block diagram showing a general configuration of a timing system 10 of the present invention. A transmit oscillator 12 oscillates at a frequency $F_T$, typically 1 MHz. Oscillator 12 directly provides a squarewave TX clock output. A second oscillator 14 operates at the $N^{th}$ harmonic frequency $NF_T$ minus a small offset $\Delta$ from a harmonic $NF_T$ of oscillator 12, typically 10.00000 MHz–1 kHz. The output of oscillator 14 passes through pulse selector 18 to produce a RX clock signal which has the same frequency as the TX clock signal, i.e. $F_R=F_T$, but has a swept leading edge.

Figure 2A:
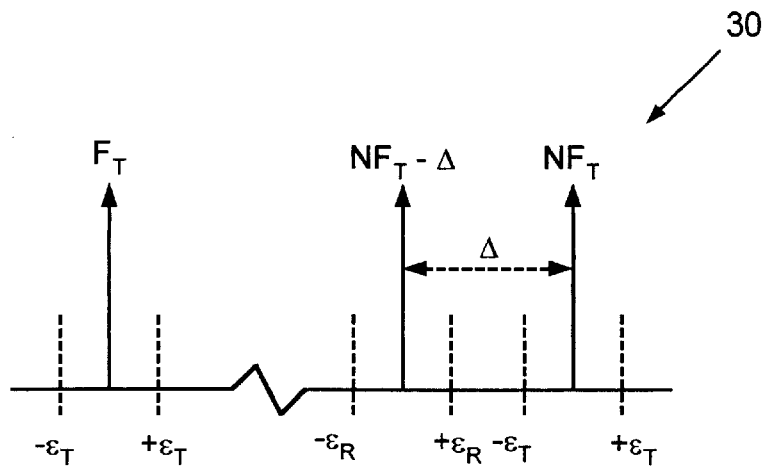
FIG. 2a indicates the frequency relations between the transmit oscillator frequency $F_T$, its $N^{th}$ harmonic at $NF_T$, and the receive oscillator frequency located at an offset $-\Delta$ from $NF_T$, generally for the system of FIG. 1.

FIG. 2a shows the general frequency relation 30 between transmit oscillator 12 at frequency $F_T$, its harmonic at $NF_T$, and receive harmonic oscillator 14 at frequency $NF_T-\Delta$. In principle, oscillator 14 may operate at $NF_T+\Delta$, but that would time-reverse the phase slip between the two oscillators and make the expanded-time waveforms appear reversed. In many systems, that would not affect performance. Throughout this description, $-\Delta$ will be used for simplicity without departing from the scope of the invention.

Another simplifying assumption is that the second oscillator 14 operates at a small offset from a harmonic of the first oscillator 12. In reality, both oscillators may operate at any frequency that produces a beat frequency at (1) their fundamentals, at (2) a fundamental of one and a harmonic of the other (as typically described herein), or at (3) mutually common harmonics. Mutually common harmonics occur when the $N^{th}$ harmonic of the first oscillator 12 coincides with the $M^{th}$ harmonic of the second oscillator 14. For example, oscillator 12 may operate at 3 MHz and oscillator 14 may operate at 11 MHz, both with a common harmonic at 33 MHz. In this case the offset frequency is defined by $N \times M-\Delta$. Throughout this description, the $N^{th}$ harmonic of the first oscillator 12 will be beat with the fundamental of the second oscillator.

Referring again to FIG. 2a, $\pm\epsilon_R$ error bands and $\pm\epsilon_T$ error bands are indicated about the oscillator frequencies $F_T$, $NF_T$ and $F_R$ respectively. These error bands represent the maximum error, in PPM, of each oscillator over initial manufacture, temperature, and aging. Crystal oscillators, for example, may be specified (at low cost) with an initial error of 30 PPM, and may have a temperature drift of ±20 PPM. Added to this may be another 50 PPM drift with age for a total error band of 100 PPM. Thus, the minimum difference $\Delta$ must be 200 PPM. In reality, there will be considerable tracking with temperature and aging so $\Delta$ might be 100 PPM. As will be discussed later with reference to FIG. 5, oscillator frequency errors can be made to be of little consequence. An important point is that one of the two oscillators is offset from the other by an amount $\Delta$ to allow for phase slippage. Generally, the first oscillator is set to a precise frequency (or it may be an atomic clock), and the second oscillator is trimmed to the desired offset frequency $\Delta$. In most radar systems, a higher value of $\Delta$ will provide faster range sweeps and thus a faster measurement rate, but the receiver bandwidth must be higher and the system S/N will be lower. Thus, the exact value of $\Delta$ will be selected in consideration of both the radar system performance and the initial cost of an accurate crystal clock.

The aging rate of quartz crystals can be inferred from color TV receivers in the U.S., each of which has a 3.58 MHz crystal that has to be locked to an atomic clock resident with each network TV broadcaster. If the 3.58 MHz crystal drifts more than 50 PPM with age and temperature, it is unlikely to achieve a lock to the atomic reference and the TV will grossly fail to present the proper tint. The fact that this happens rarely in spite of the harsh conditions inside a TV receiver, indicates that age and temperature drift exceeding 50 PPM is rare. Consequently, a minimum value for $\Delta$ of 100 PPM would suffice for the open loop architecture of FIG. 1.

Figure 2B:
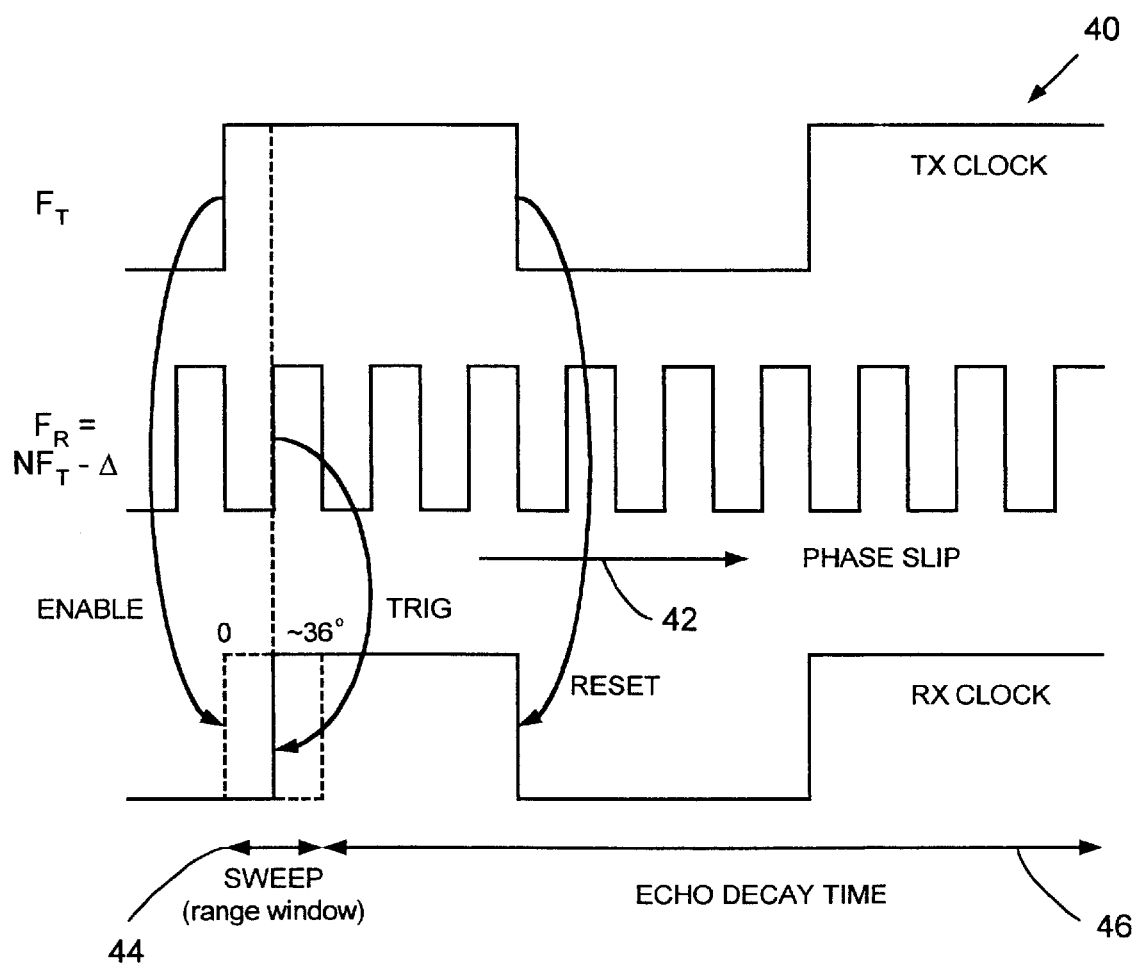
FIG. 2b depicts the timing relations between the TX clock of frequency $F_T$, the harmonically related receive oscillator at frequency $NF_T-\Delta$, and the RX clock.

FIG. 2b depicts the timing relationships 40 pertaining to the system of FIG. 1. The upper waveform is the TX clock at frequency $F_T$ provided by first oscillator 12. The middle waveform is the oscillation provided by the second oscillator 14 at frequency $NF_T-\Delta$, which is slipping in phase to the right relative to the TX clock, as indicated by the arrow 42. The bottom waveform is the RX clock, which is the output of the pulse selector 18 of FIG. 1. The RX clock has the same frequency as the TX clock. The positive-going edge of the RX clock is triggered by a positive-going edge of the middle waveform, but only after the TX clock has gone high. Assuming the radar system operates on positive edges, the receiver gate cannot be triggered before the transmitter is triggered by the TX clock, and cannot be triggered later than one cycle in duration of the middle waveform (typically about 36 degrees). These limits define a sweep (range) window 44 during which the positive going edge of the RX clock can be triggered. The negative going edge of the RX clock is triggered (reset) by the negative going edge of the TX clock.

Figure 3A:
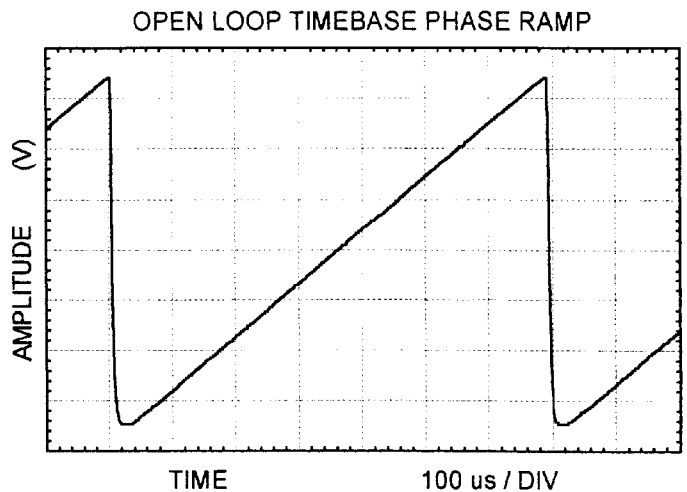
FIG. 3a is a phase ramp waveform generated by an embodiment of the system of FIG. 1.

FIG. 3a is a plot of the phase slippage between the TX clock and the RX clock. The waveform was derived from a phase-to-voltage converter, although a simple EXOR gate and lowpass filter could have been used with lower accuracy. As might be expected, the slip rate is linear and increasing in phase. It also has a sharp sawtooth shape indicating that when one pulse of the second oscillator reaches one full period in phase slippage (relative to enabling the pulse selector), another pulse enters the sweep window 44 of FIG. 2b and restarts the phase ramp.

Figure 3B:
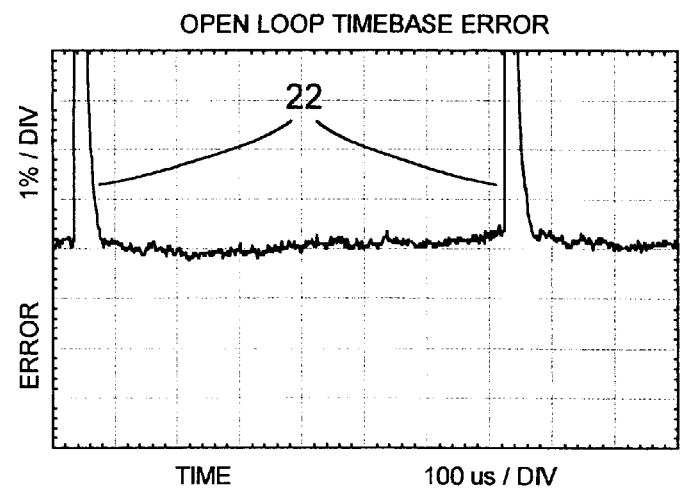

FIG. 3b is an error plot of the phase slippage waveform of FIG. 3a. It is a deviation in linearity and is seen to be on the order of 0.1%. It is most likely much better, after accounting for measurement instrumentation errors. The spikes 22 are due to measurement artifacts.

Figure 3C:
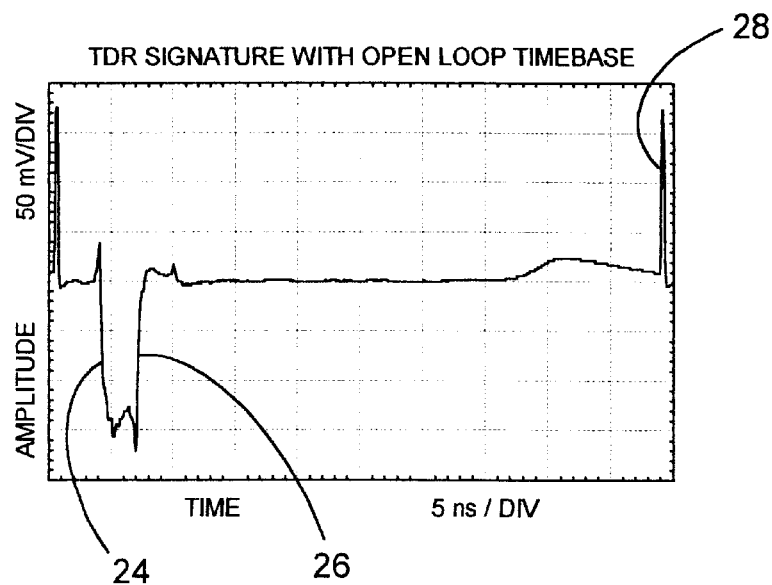
FIG. 3c shows a TDR waveform taken at the baseband output of a TDR embodiment of the system as seen in FIG. 8.
Figure 8:
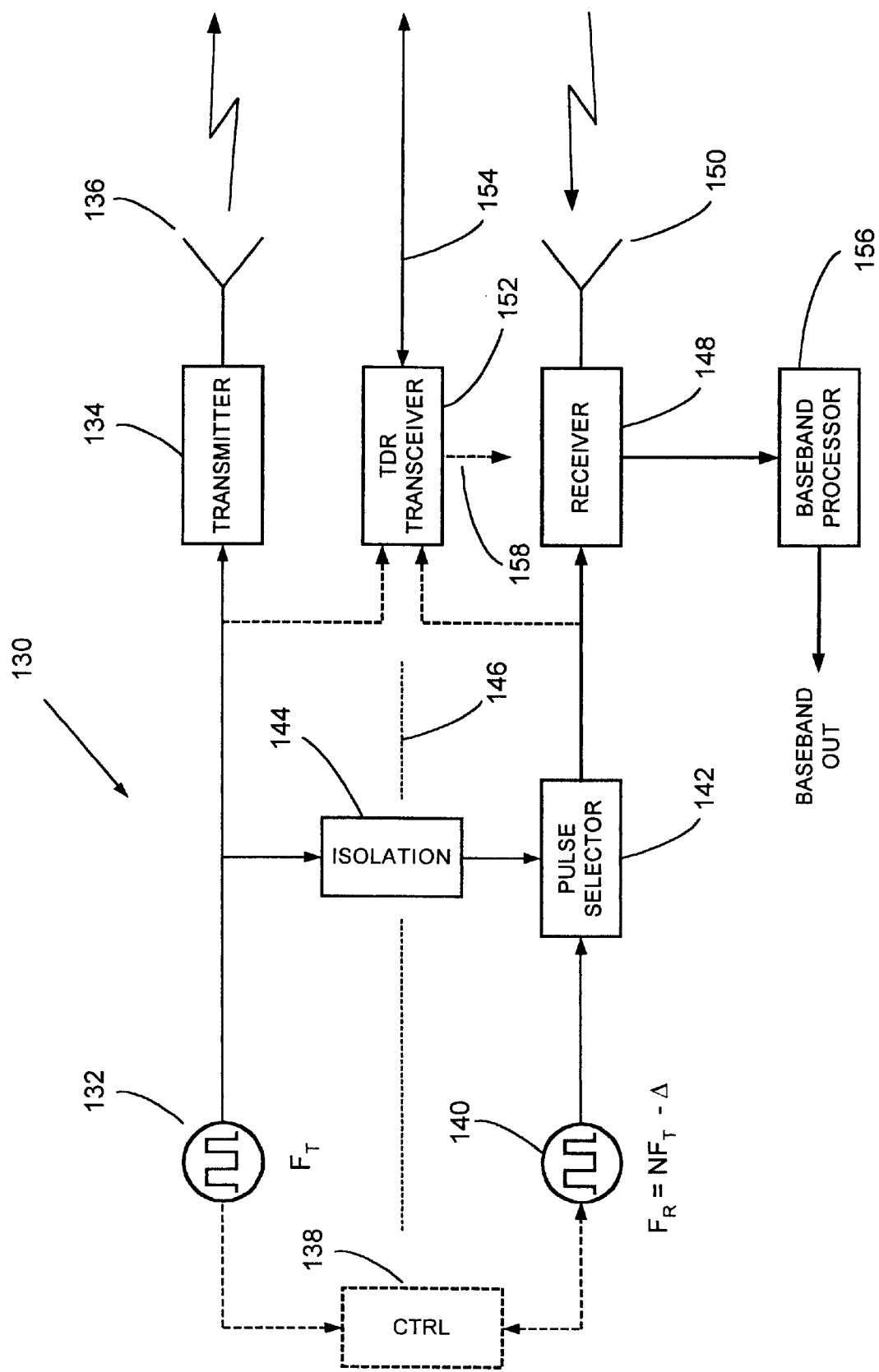
FIG. 8 is a block diagram of the general timing system of the present invention configured to operate with a transmitter and receiver, or with a transceiver.

FIG. 3c is a waveform plot of a TDR system of FIG. 8 using the open loop timing system of FIG. 1 of the present invention. It shows a transmitted step function 24 and a reflected edge 26 from a short in a 33 cm coaxial cable. An artifact 28 occurs when the phase ramp resets to zero.

Returning to FIG. 1, high phase slip accuracy requires that digital noise from the TX clock be isolated from the second oscillator and RX clock. Dashed line 20 indicates shielding, and isolation element 16 further prevents unwanted coupling. Typically, isolation element 16 is a resistor to limit transient currents. Experiments indicate that CMOS switching transients can couple across multiple gate inputs, e.g., as in pulse selector 18, and can produce an error of more than 100 ps (about 1.5 cm in radar range). Since this coupling is capacitive and transient, a simple resistor limits this current and effectively diminishes transient coupling to less than the noise floor of the overall system.

Figure 4:
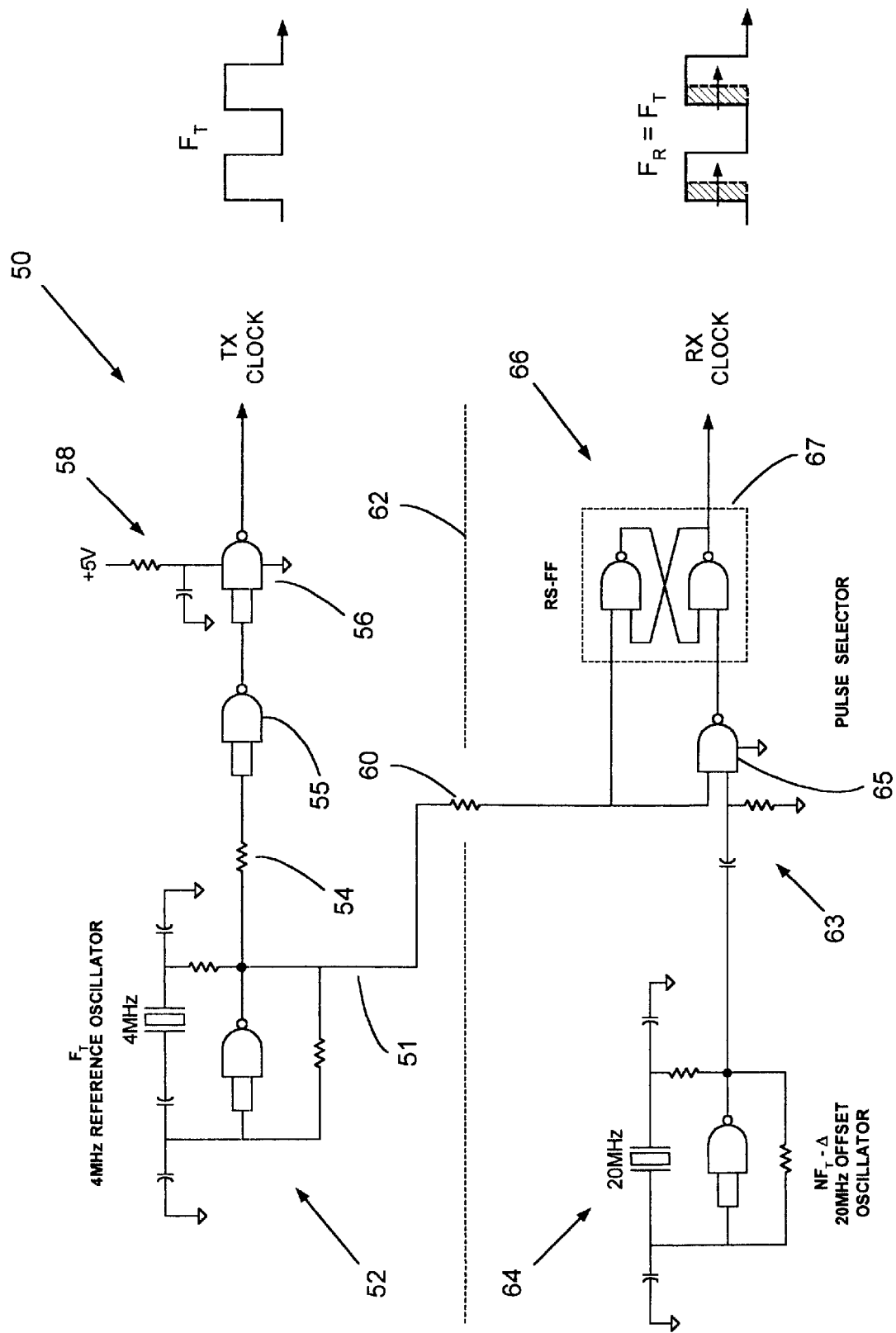
FIG. 4 is a schematic diagram of the TX and RX clock circuits of the present invention, based on the block diagram of FIG. 1.

FIG. 4 is a detailed schematic diagram of an embodiment 50 of the timing system generally depicted in FIG. 1. A transmit crystal oscillator 52 oscillates at a frequency $F_T=4$ MHz, in this example. Its output is coupled through a resistor 54 to series gates 55, 56 to provide a TX clock squarewave output. Resistor 54 combines with gate 55's input capacitance to produce a generally small delay on the order of several nanoseconds to compensate similar delays in the pulse selector 66 and other delays in the overall system, such as in the transmitter 134 or receiver 148 of FIG. 8. Power supply decoupling network 58 (shown connected to gate 56) eliminates error-producing crosstalk coupled from oscillator and selector circuits 64, 66.

A second oscillator 64 operates at the $5^{th}$ harmonic of oscillator 52, minus a small offset $\Delta$, or typically 20.00000 MHz–2 kHz. Oscillator 64 is coupled through an RC differentiation network 63 to one input of NAND gate 65 and through NAND gate 65 to one input of a reset-set flip-flop (RS-FF) 67. These three gates (gate 65 and the two gates of RS-FF 67) comprise the pulse selector circuit 66. An enable line 51 is connected from oscillator 52 through isolation resistor 60 and shielding 62 to the selector circuit 66 at the second input of NAND gate 65 and the second input to RS-FF 67. Whenever the enable line goes high and a positive-going edge is provided by oscillator 64, pulse selector 66 flips to a high level at its output on the RX clock line. Thereafter, when the input from oscillator 52 goes low, the output of the pulse selector goes low regardless of the state of the second oscillator 64 since line 51 is connected to the other input of NAND gate 65. Accordingly, the frequency of the RX clock is locked to the frequency of the transmit clock, but the positive-going edge of the RX clock varies in phase depending on the phase of the second oscillator 64. As explained earlier, this positive edge variation slips in phase at an extremely linear rate set by $\Delta$.

Figure 5:
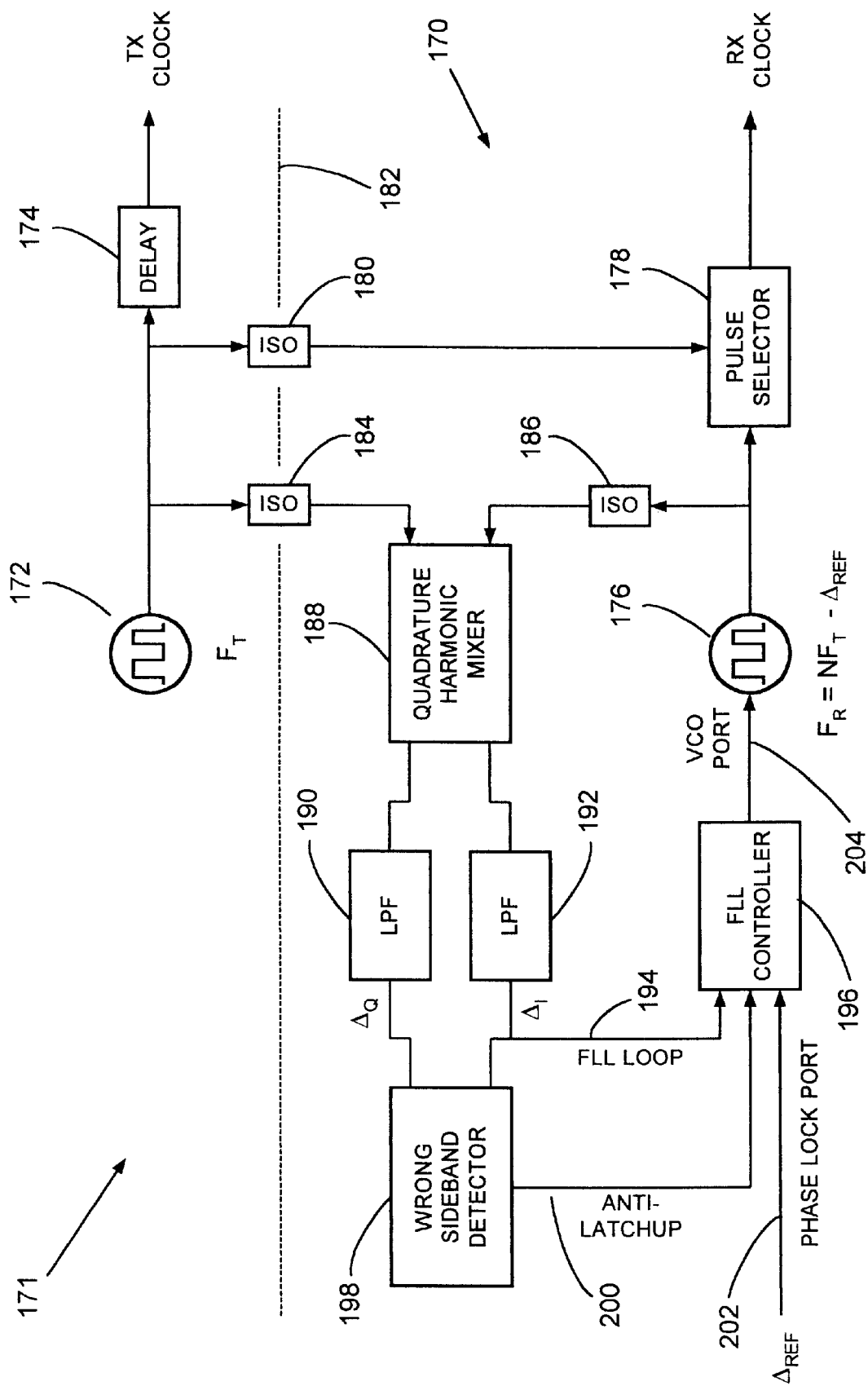
FIG. 5 is a block diagram of the present invention further incorporating offset frequency and phase control.

FIG. 5 shows a timing circuit 170 of the present invention with a frequency locked loop (FLL) 171 to control the frequency of a voltage-controlled second oscillator 176 relative to the $N^{th}$ harmonic of a first oscillator 172. The operation of the first oscillator 172, the second oscillator 176, isolation element 180, shielding 182, delay element 174, and pulse selector 178 are similar to corresponding elements of FIG. 1 or FIG. 4.

Oscillators 172 and 176 are coupled through isolation elements 184, 186 (generally resistors) to a quadrature harmonic mixer 188, which is further coupled to lowpass filters 190 and 192 to provide in-phase and quadrature beat frequencies $\Delta_I$ and $\Delta_Q$ respectively. Harmonic mixer 188 mixes the $N^{th}$ harmonic of oscillator 172 at frequency $NF_T$ and, generally, the fundamental frequency of oscillator 176 at a frequency of $NF_T-\Delta$. Naturally, other harmonics are mixed but no others have a sufficiently small $\Delta$ to get past the lowpass filters 190,192.

The beat frequency $\Delta_I$ is applied via line 194 to FLL controller 196 which controls the frequency of oscillator 176 via a voltage controlled oscillator (VCO) control port 204. The FLL controller 196 converts frequency $\Delta_I$ to a voltage and compares it to a reference voltage. Any voltage difference drives a control amplifier within the FLL controller 196 to servo oscillator 176 to the correct frequency.

The FLL controller 196 has a phase lock port 202 which accepts an input of frequency $\Delta_{REF}$ and locks the offset frequency $\Delta_f$ to $\Delta_{REF}$ using a phase locking mechanism within the FLL controller 196.

A wrong sideband detector 198 generates pulses whenever $\Delta_f$ is positive rather than negative (or vice-versa, depending on how the system is set up). The pulses are coupled via line 200 to the FLL controller 196 and cause the controller 196 to servo oscillator 176 down in frequency until a lock is achieved with $\Delta_f$ negative.

Figure 6:
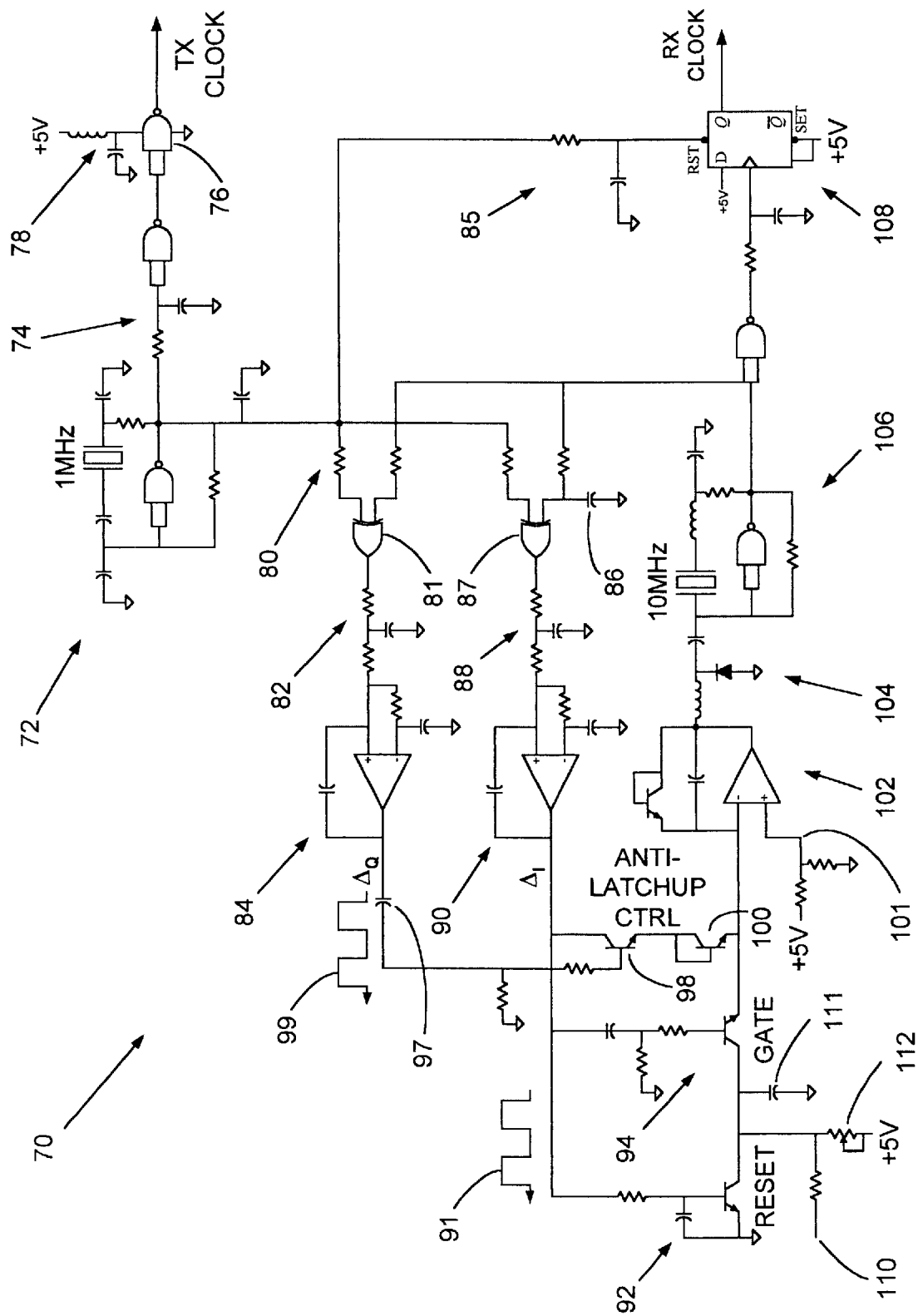
FIG. 6 is a schematic diagram of the present invention as depicted in FIG. 5.

FIG. 6 is a detailed schematic diagram of a precision timing circuit 70 of the present invention and is based on the block diagram of FIG. 5. Transmit oscillator 72, delay element 74, buffer gate 76 and power supply decoupling network 78 are similar to elements 52, 54, 56 and 58 of FIG. 4, and generate a b 1MHz TX clock, for example.

Receive oscillator 106 is a VCO operating at 10 MHz–$\Delta_f$, where $\Delta_f$ is typically 50 Hz. It employs a diode, an inductor and a capacitor network (or port) 104 to voltage-tune the oscillator, which is otherwise of a standard CMOS configuration.

All the logic gates shown in FIGS. 4 and 6 are of the popular 1-micron 74ACxx family, and the op amps are common CMOS types such as Toshiba TS274.

Pulse selector 108 is comprised of a D-input flip-flop and operates as described for corresponding element 66 of FIG. 4. Its enable path from the TX clock is provided by isolation network 85.

Mixers 81, 87, comprised of EX-OR gates, receive oscillations via isolation resistors 80, from oscillators 72, 106 and provide sum and difference frequencies to lowpass filters 82, 88 which are coupled to op-amp connected comparators 84, 90 to produce in-phase $\Delta_I$ and quadrature $\Delta_Q$ difference frequency digital pulses respectively. Capacitor 86 provides ~90 degrees phase shift to mixer 87 for quadrature operation. The $\Delta_I$ pulses 91 reset the voltage on a capacitor 111 via reset circuit 92. Capacitor 111 then charges via resistor 112 to a voltage determined by the charge duration $1/\Delta_f$, and its voltage is then peak-sampled via gate stage 94 to loop control amplifier 102. If the gated capacitor voltage differs from a reference voltage applied to amplifier 102 at node 101, the amplifier output will servo the VCO 106 via network 104 until the difference frequency $\Delta_f$ and accordingly the peak sampled voltage on capacitor 111 matches the amplifier's reference voltage at node 101. Hence, frequency control, or lock, is achieved.

The FLL loop control system is of a sampling type, i.e., employs gate 94 and integrating control amplifier 102 to provide an extremely low ripple, steady frequency control voltage to network 104 (VCO control port 204 of FIG. 5). Were the frequency control voltage to vary during one period of $\Delta_f$, the instantaneous frequency would vary with a resultant non-uniformity in the phase slippage. An alternative control system might heavily lowpass filter the squarewaves $\Delta_I$ to a very steady DC voltage and not sample the voltage. The problem with that approach is that too much delay and phase shift would be inserted into the FLL control loop by a low-frequency high-order lowpass filter. The peak-sampled architecture of the present invention is the best approach for fast loop response and minimum components.

An optional phase lock injection port is provided at 110. When a squarewave of frequency $\Delta_{REF}$ is applied to port 110 that is within ~10% of the equilibrium frequency of the FLL, the FLL will phase lock $\Delta_f$ to $\Delta_{REF}$ through an interaction mechanism stemming from the peak sampled voltage across capacitor 111, which is a function of both $\Delta_f$ and $\Delta_{REF}$.

One great advantage to the use of an FLL (in addition to achieving a reliable low offset frequency $\Delta$) is that the VCO can be made to tune over more than 100 PPM, which is more than the expected tolerance variations between the two oscillators. Thus, low cost crystals can be used and the VCO will always achieve a frequency lock between the two crystal oscilators without any manual tuning during manufacture.

With the FLL locking to an offset frequency at $NF_T-\Delta=$ 9.999950 MHz in this example, it is entirely likely that the loop may tend to lock at $NF_T+\Delta=10.00005$ MHz. In reality, once the VCO exceeds 10.0000 MHz, the control loop exhibits positive feedback and latches up. To avoid this likelihood, the squarewave 99 (output $\Delta_Q$) is applied to anti-latchup transistor 98 that acts as a comparison gate between the $\Delta_I$ pulses and differentiated $\Delta_Q$ pulses (coupled through differentiation capacitor 97). Whenever the VCO exceeds 10.0000 MHz, transistor 98 begins to pass pulses via isolation diode 100 (transistor configured as diode) to the control amplifier 102 that servos the amplifier down in frequency until the VCO is below 10.0000 MHz, where normal negative feedback takes over and servos the amplifier to proper equilibrium at an offset of $-\Delta_f$.

Figure 7A:
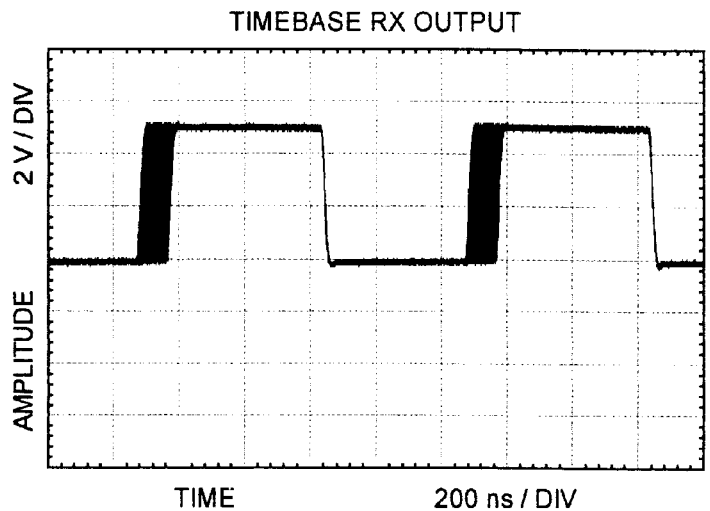
FIG. 7a is an RX clock waveform produced by an embodiment of the system of FIG. 6.

FIG. 7a is an RX clock waveform appearing at the output of pulse selector 108. As can be seen, the positive-going edges are spread across a range of delays in this waveform, which contains thousands of overlaid waveforms (infinite persistence mode). The phase slippage of the positive edge is seen to span 100 ns on a 1 μs period waveform, and corresponds to the 1 MHz and 10 MHz oscillators 72, 106 respectively in FIG. 6.

Figure 7B:
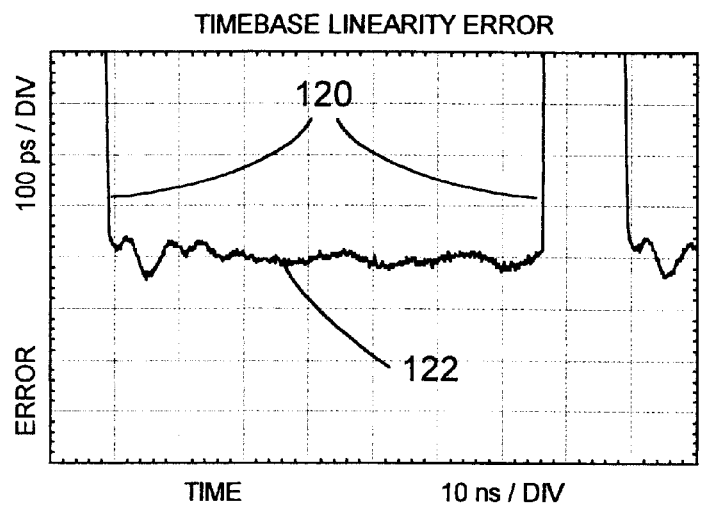
FIG. 7b is an error waveform similar to FIG. 3b, except derived from the system of FIG. 6.

FIG. 7b is an error plot of the phase ramp generated by the circuit of FIG. 6. Over most of the plot, the error 122 is less than about 10-picoseconds. There are major artifacts 120 due to the phase-to-voltage converter used to obtain this error plot. Most of the error 122 seen in FIG. 7b is believed to be in the test instrumentation and not in the circuit of FIG. 6. In any case, an error of 10 ps corresponds to 1.5 mm range error out of a span of 15-meters. While that is a very accurate figure, the stability of a measurement using the present invention of FIG. 6 is much higher and is mainly limited by the stability of the transmit oscillator 72, which may be an ovenized crystal oscillator or may be substituted with an atomic reference.

Figure 7C:
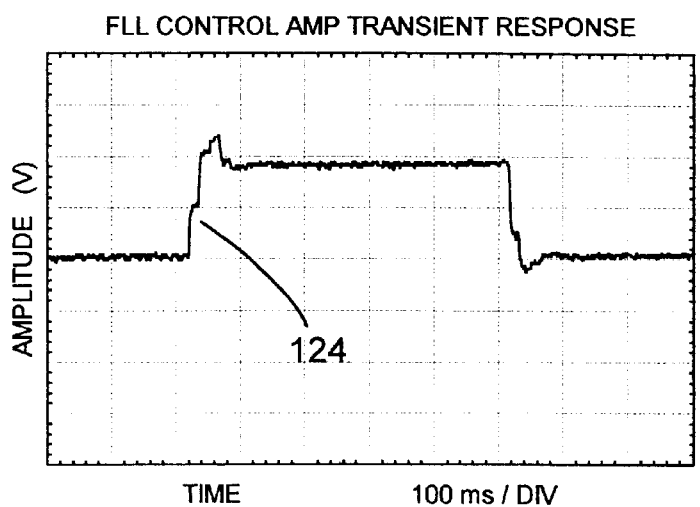
FIG. 7c is a transient response waveform for the FLL control amplifier of FIG. 6.

FIG. 7c indicates the dynamics of the FLL control amplifier 102 of FIG. 6. It is a plot of the voltage applied to the VCO network (port) 104 in response to a 1 Hz frequency step in $\Delta_{REF}$ at phase lock port 110. As can be seen, the transient response 124 is quite rapid. The staircasing seen in transient response 124 is due to the 50 Hz sampled data nature of the loop.

FIG. 8 shows a general pulse-echo application of the timing system 130 of the present invention. The transmit and receive oscillators 132 and 140, isolation element 144, shielding 146, pulse selector 142, and optional FLL control element 138 comprise a timing system of the present invention as previously described herein. The transmit oscillator 132 drives a transmitter element 134 which may be an impulse radar, pulsed RF radar, a pulsed laser, or even a pulsed ultrasonic source. The transmitter is coupled to transducer element 136 for radiation into a propagating medium. The transducer may be an antenna, a laser/lens, or an acoustic transducer.

A receive transducer element 150 is of comparable nature to element 136 and receives echoes generated by transducer 136 and couples them to receiver 148, which is a gated, sampling type receiver, such as that described in co-pending application, "Charge Transfer Wideband Sample-Hold Circuit", Ser. No. 09/084,502, by McEwan. Its gate pulses are derived from oscillator 140 via pulse selector 142.

Receiver 148 outputs individual samples, or a number of integrated samples, to baseband processor 156 which generally contains amplifiers, filters, and other elements common to equivalent time receivers, such as disclosed in copending application, "Precision Short-Range Pulse-Echo Systems With Automatic Pulse Detectors", Ser. No. 09/120, 994, by McEwan. The baseband output signal may be an equivalent time analog replica of the RF, optical or acoustic echo, or it may be a digital pulse with a width proportional to range.

Alternatively, the timing system 130 of FIG. 8 may drive a time domain reflectometer (TDR) transceiver 152 which is connected to a cable 154 to determine the location of discontinuities in the cable's impedance through reflections, as illustrated in FIG. 3c. The output 158 of the transceiver 152 connects to baseband processor 156. A common application for the TDR configuration is as an "electronic dipstick" wherein the cable may be a single wire transmission line inserted into a liquid in a tank, such as a gas tank on an automobile.

Figure 9:
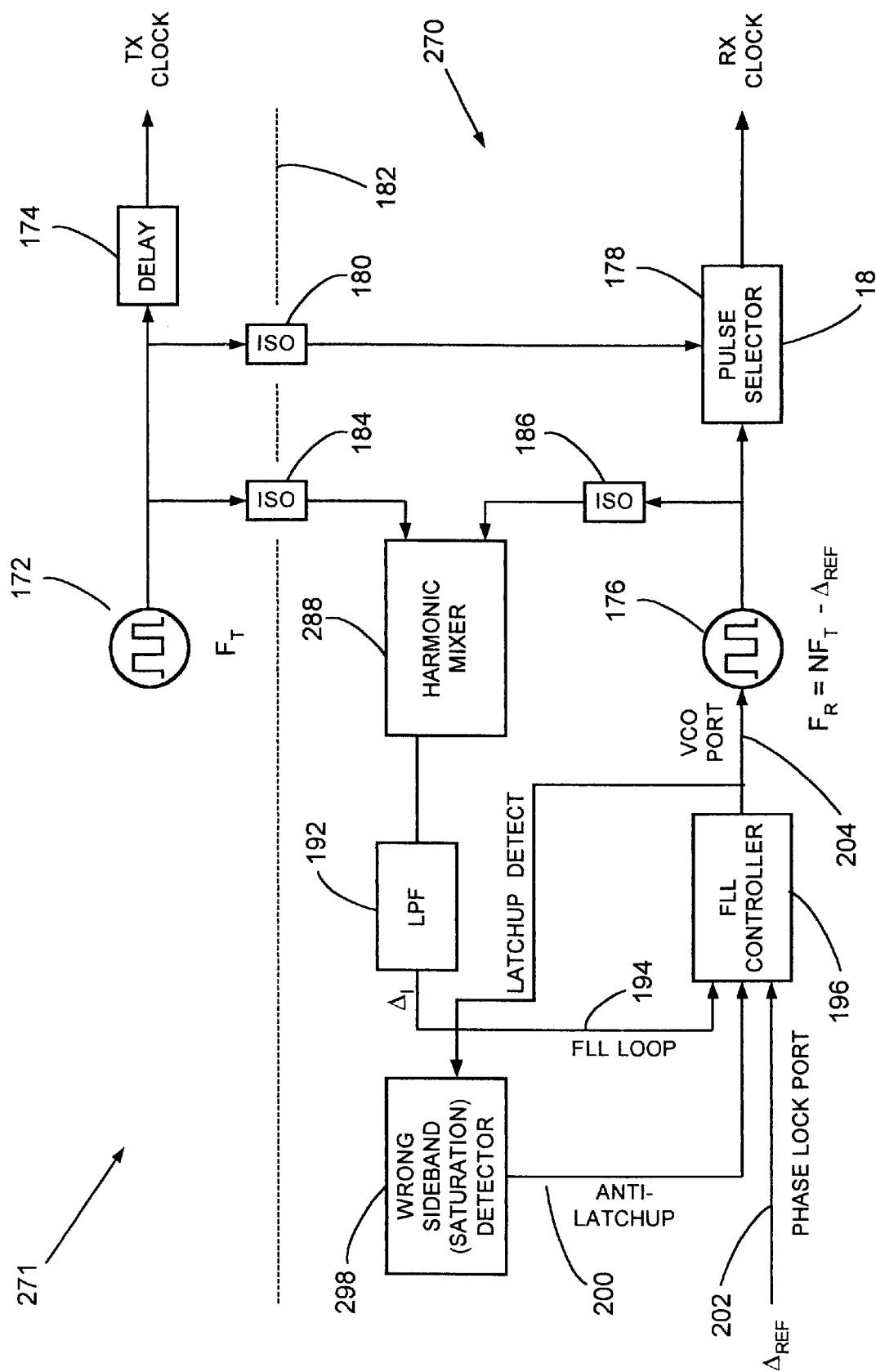
FIG. 9 is a block diagram of the present invention with a control voltage saturation detector as a wrong-sideband detector.

FIG. 9 depicts timing circuit 270 with a frequency locked loop (FLL) 271 which is similar to timing circuit 170 with FLL 171 of FIG. 5 except that it utilizes a wrong sideband detection scheme that is an alternative to the quadrature detection scheme of FIGS. 5 and 6. A wrong sideband condition causes the voltage on the VCO line 204 to go into saturation, or latchup, in which case the FLL CONTROLLER 196 output swings to a maximum. This condition occurs because operation on the wrong sideband causes the FLL to operate with opposite, or positive, feedback. Thus, wrong sideband detector 298 can be configured to detect this overvoltage (saturation) condition and apply corrective anti-latchup pulses on line 200 whenever there is a wrong sideband condition. The output signals of oscillators 172 and 176 are input to a harmonic mixer 288 which produces a difference frequency output which is coupled through LPF 192 to FLL controller 196. The output of FLL controller 196 is input to wrong sideband (saturation) detector 298 which provides a control signal back to the FLL controller 196. The advantage to this type of wrong-sideband detector is the quadrature mixer 81 and low-pass filter 84 of FIG. 6 can be deleted (although an additional op amp or comparator is needed for latchup detection).

Changes and modifications in the specifically described embodiments can be carried out without departing from the scope of the invention which is intended to be limited only by the scope of the appended claims.

What is claimed is:

1. A precision clock delay circuit comprising:
   first and second oscillators,
   the first oscillator providing a transmit clock output at a first oscillator frequency,
   the second oscillator operating at a frequency that differs by a small offset from a harmonic of the first oscillator frequency,
   a gated pulse selector connected to the second oscillator to provide a receive clock output,
   a coupling path from the first oscillator to the pulse selector gate.

2. The circuit of claim 1 further comprising an isolation element in the gate coupling path between the first oscillator and the pulse selector.

3. The circuit of claim 1 further comprising a shield between the first oscillator and the second oscillator and pulse selector.

4. The circuit of claim 1 wherein the $N^{th}$ harmonic of the first oscillator is located at a small offset frequency from the fundamental of the second oscillator.

5. The circuit of claim 1 wherein the $N^{th}$ harmonic of the first oscillator is located at a small offset frequency from the $M^{th}$ harmonic of the second oscillator.

6. The circuit of claim 1 wherein the pulse selector triggers on only one pulse from the second oscillator for each pulse from the first oscillator.

7. The circuit of claim 1 wherein the transmit and receive clock outputs operate at the same frequency.

8. The circuit of claim 7 wherein one edge of the receive clock output slips in phase, while the other edge remains at a fixed phase relative to the transmit clock output.

9. The circuit of claim 2 wherein the isolation element comprises a series resistor.

10. The circuit of claim 1 further comprising a transmitter connected to the transmit clock output for transmitting pulses into a medium, and a gated receiver connected to the receive clock output for receiving pulses from the medium.

11. The circuit of claim 10 wherein the transmitter and receiver comprise a radar, laser, ultrasound or TDR ranging system.

12. The circuit of claim 1 further comprising a frequency locked loop (FLL) circuit connected to the first and second oscillators for regulating the offset frequency.

13. The circuit of claim 12 further comprising isolation elements in the gate coupling path and FLL paths between the first oscillator, the pulse selector, and the FLL circuit.

14. The circuit of claim 12 further comprising a shield between the first oscillator and the second oscillator, pulse selector and FLL circuit.

15. The circuit of claim 12 wherein the $N^{th}$ harmonic of the first oscillator is located at a small offset frequency from the fundamental of the second oscillator.

16. The circuit of claim 12 wherein the $N^{th}$ harmonic of the first oscillator is located at a small offset frequency from the $M^{th}$ harmonic of the second oscillator.

17. The circuit of claim 12 wherein the pulse selector triggers on only one pulse from the second oscillator for each pulse from the first oscillator.

18. The circuit of claim 12 wherein the FLL circuit further comprises a quadrature mixer, a wrong sideband detector, and an anti-latchup control.

19. The circuit of claim 12 wherein the FLL circuit further comprises a harmonic mixer, a saturation detector, and an anti-latchup control.

20. The circuit of claim 12 wherein the FLL circuit comprises a gate and integrating control amplifier to provide a control signal to the second oscillator.

21. A method for generating a swept clock delay, comprising:
   generating a first oscillation at a first oscillation frequency;
   generating a second oscillation at a second oscillation frequency that differs by a small offset from a harmonic of the first oscillation frequency;
   obtaining a selected pulse from the second oscillation after each occurrence of a pulse from the first oscillation to produce transmit and receive clock pulses.

22. The method of claim 21 wherein the $N^{th}$ harmonic of the first oscillation and the $M^{th}$ harmonic of the second oscillation differ by a small offset.

23. The method of claim 21 further comprising applying the clock pulses to drive a radar, laser, ultrasound or TDR ranging system.

24. The method of claim 21 further comprising regulating the small offset frequency.

25. The method of claim 24 wherein the $N^{th}$ harmonic of the first oscillation and the $M^{th}$ harmonic of the second oscillation differ by a small offset.

26. The method of claim 24 further comprising detecting wrong sideband operation of the second oscillator and resetting to the correct sideband.

27. The method of claim 24 further comprising reducing phase slippage nonlinearities.

28. The method of claim 27 wherein phase slippage is reduced by sampling and holding a control signal.

29. The method of claim 24 further comprising applying the clock pulses to drive a radar, laser, ultrasound, or TDR ranging system.

30. A timing circuit, comprising:
   a transmit clock circuit comprising:
      a first oscillator operating at a first frequency to produce a transmit clock signal,
   a receive clock circuit comprising:
      a second oscillator operating at a small offset from a harmonic of the first frequency, and
      a pulse selector that is first enabled by the transmit clock signal and then triggered by pulses from the second oscillator to produce a receive clock signal of the same frequency as the transmit clock signal but with one edge that accurately slips in phase across a limited range.

31. The circuit of claim 30 wherein the oscillators are crystal oscillators.

* * * * *